US009916789B2

(12) United States Patent
Shin (10) Patent No.: US 9,916,789 B2
(45) Date of Patent: Mar. 13, 2018

(54) ORGANIC LIGHT-EMITTING DIODE DISPLAY AND METHOD OF DRIVING THE SAME

(71) Applicant: Samsung Display Co., Ltd., Yongin-si, Gyeonggi-do (KR)

(72) Inventor: Hwang Sup Shin, Seongnam-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 13 days.

(21) Appl. No.: 15/140,288

(22) Filed: Apr. 27, 2016

(65) Prior Publication Data
US 2016/0321995 A1 Nov. 3, 2016

(30) Foreign Application Priority Data

Apr. 28, 2015 (KR) .................. 10-2015-0059992

(51) Int. Cl.
*G09G 3/32* (2016.01)
*G09G 3/3258* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC .. G09G 3/3258; G09G 3/3233; G09G 3/3266; G09G 3/3275; G09G 3/3225; G09G 3/3291; G09G 2300/0426; G09G 2310/08; G09G 2320/0626; G09G 2300/0861; G09G 2310/0251; G09G 2310/0262; H01L 27/3248; H01L 27/3262; H01L 27/3265; H01L 27/3276
See application file for complete search history.

(56) References Cited

U.S. PATENT DOCUMENTS 7,605,599 B2 10/2009 Kwak et al.
2012/0026144 A1* 2/2012 Kang .................. G09G 3/3225
345/211
(Continued)

FOREIGN PATENT DOCUMENTS

KR 10-2009-0050010 A 5/2009
KR 10-2012-0010824 A 2/2012

*Primary Examiner* — Richard Hong
(74) *Attorney, Agent, or Firm* — Knobbe Martens Olson & Bear LLP (57) ABSTRACT

An organic light-emitting diode display and a method of driving the same are disclosed. In one aspect, the display includes a light emission control line configured to provide a light emission control signal and a power line configured to provide a power voltage. An operation control TFT is electrically connected to the power line and configured to be turned on based on the light emission control signal so as to provide the power voltage. A driving TFT is electrically connected to the operation control TFT, an OLED is electrically connected to the driving TFT, and an initialization TFT is configured to provide the power voltage to the driving TFT. In a frame of the OLED display, the power voltage provided when the initialization TFT is turned on and the power voltage provided when the operation control TFT is turned on are different from each other.

17 Claims, 6 Drawing Sheets

(51) Int. Cl.
*G09G 3/3233* (2016.01)
*G09G 3/3266* (2016.01)
*G09G 3/3275* (2016.01)
*H01L 27/32* (2006.01)

(52) U.S. Cl.
CPC ....... *G09G 3/3275* (2013.01); *H01L 27/3248* (2013.01); *H01L 27/3262* (2013.01); *H01L 27/3265* (2013.01); *H01L 27/3276* (2013.01); *G09G 2300/0426* (2013.01); *G09G 2300/0861* (2013.01); *G09G 2310/0251* (2013.01); *G09G 2310/0262* (2013.01); *G09G 2310/08* (2013.01); *G09G 2320/0626* (2013.01)

(56) References Cited

U.S. PATENT DOCUMENTS

2013/0201172 A1* 8/2013 Jeong ................... G09G 3/3233
345/212
2013/0342114 A1* 12/2013 Lee ....................... G09G 3/3291
315/169.3

* cited by examiner

ORGANIC LIGHT-EMITTING DIODE DISPLAY AND METHOD OF DRIVING THE SAME

INCORPORATION BY REFERENCE TO ANY PRIORITY APPLICATIONS

This application claims priority to and the benefit of Korean Patent Application No. 10-2015-0059992 filed on Apr. 28, 2015, the entire contents of which are incorporated herein by reference.

BACKGROUND

Field

The described technology generally relates to an organic light-emitting diode display and a method of driving the same.

Description of the Related Technology

The luminance of an organic light-emitting diode (OLED) is controlled by a current or a voltage. Since OLED displays are suitable for use in high contrast and rapid response devices, they are commonly used in mobile phones, smartphones, laptop computers, digital broadcasting terminals, personal digital assistants (PDA), portable multimedia players (PMP), navigations, slate computers, tablet computers, ultrabooks, wearable devices, digital TVs, desktop computers, digital signage, and the like.

An OLED display includes scan lines, data lines, power lines, and pixel circuits connected to the scan, data, and power lines in a matrix form. Further, each of the pixel circuits typically includes an OLED, a plurality of transistors that respectively include a switching transistor transmitting a data signal, and a driving transistor driving the OLED according to the data signal, as well as a capacitor maintaining data voltage.

As the resolution of display devices increases, the pixels are integrated with greater densities. Since each pixel occupies a limited area, a predetermined area must ensure that the thin film transistors and capacitors can be formed.

The above information disclosed in this Background section is only to enhance the understanding of the background and therefore it may contain information that does not constitute the prior art that is already known in this country to a person of ordinary skill in the art.

SUMMARY OF CERTAIN INVENTIVE ASPECTS

One inventive aspect relates to an OLED display and a method of driving the same in which an area of elements included in a pixel can be ensured.

Another aspect is an OLED display which includes a substrate, a scan line formed on the substrate and transmitting a scan signal, an initialization line formed on the substrate and transmitting an initialization signal, a light emission control line formed on the substrate and transmitting a light emission control signal, a data line crossing the scan line and transmitting a data signal, and a power line crossing the scan line and transmitting a power voltage, the OLED display including: a switching thin film transistor connected to the scan line and the data line; a driving thin film transistor connected to a drain of the switching thin film transistor; an OLED connected to a drain of the driving thin film transistor; an initialization thin film transistor turned on by the initialization signal transmitted through the initialization line to apply the power voltage to a gate of the driving transistor; and an operation control thin film transistor turned on by the light emission control signal transmitted through the light emission control line to apply the power voltage to the driving thin film transistor; wherein, in one frame, the power voltage while the initialization thin film transistor is turned on and the power voltage while the operation control thin film transistor is turned on may be different from each other.

The power line may include a first line connected to the initialization thin film transistor and a second line connected to the operation control thin film transistor, and the first line and the second line may cross each other and may be connected to each other through a contact hole.

The OLED display may further include a compensation thin film transistor compensating a threshold voltage of the driving thin film transistor and connected to the driving thin film transistor.

The OLED display may further include a light emission control thin film transistor turned on by the light emission control signal transmitted through the light emission control line to transmit the power voltage from the driving thin film transistor to the OLED, wherein the light emission control thin film transistor may be disposed between the drain of the driving thin film transistor and the OLED.

The OLED display may further include a reset line formed on the substrate and transmitting a reset signal, and a reset thin film transistor turned on by the reset signal transmitted through the reset line to apply the power voltage to an anode of the OLED.

The reset transistor may be connected to the initialization transistor and the first line.

The initialization thin film transistor and the reset thin film transistor may be simultaneously turned on.

The OLED display may further include a storage capacitor that includes one end connected to the power line and another end connected to the gate of the driving thin film transistor.

A polarity of the power voltage while the initialization thin film transistor is turned on and a polarity of the power voltage while the operation control thin film transistor is turned on may be opposite to each other.

Another aspect is a driving method of an OLED display which includes a display unit in which a plurality of pixels including an OLED are disposed, a data driver connected to the pixel, a scan driver connected to the pixel, an initialization driver connected to the pixel, a light emission driver connected to the pixel, and a power supply supplying a power voltage to the pixel, the driving method including: changing the power voltage to a low-level power voltage; the initialization driver applying an enable-level initialization signal to a pixel; and changing the power voltage to a high-level power voltage.

The driving method may further include the scan driver and the data driver writing a data signal to the pixel after the power voltage is changed to the high-level power voltage.

The driving method may further include the light emission driver applying an enable-level light emission control signal to the pixel after the data signal is written to the pixel.

The pixel may include an initialization thin film transistor turned on by the initialization signal and a driving thin film transistor supplying a driving current to the OLED, and the applying of the enable level initialization signal to the pixel by the initialization driver may include the initialization thin film transistor applying a low-level power voltage to a gate of the driving thin film transistor.

The driving method may further include the initialization driver applying an enable-level reset signal to the pixel.

The pixel may include a reset thin film transistor turned on by the reset signal, and the applying of the enable-level reset signal to the pixel by the initialization driver may include the reset thin film transistor applying the low-level power voltage to an anode of the OLED.

The applying of the enable-level initialization signal to the pixel by the initialization driver and the applying of the enable-level reset signal to the pixel by the initialization driver may be simultaneously performed.

Effects of the OLED display and the driving method thereof according to the exemplary embodiments of the present invention will be described.

Another aspect is an organic light-emitting diode (OLED) display. comprising: a substrate; a scan line formed over the substrate and configured to provide a scan signal; an initialization line formed over the substrate and configured to provide an initialization signal; a light emission control line formed over the substrate and configured to provide a light emission control signal; a data line crossing the scan line and configured to provide a data signal; a power line crossing the scan line and configured to provide a power voltage; a switching thin film transistor (TFT) electrically connected to the scan line and the data line; a driving thin film transistor electrically connected to a drain electrode of the switching thin film transistor; an OLED electrically connected to a drain electrode of the driving thin film transistor; an initialization thin film transistor configured to be turned on based on the initialization signal provided through the initialization line so as to apply the power voltage to a gate electrode of the driving thin film transistor; and an operation control thin film transistor configured to be turned on based on the light emission control signal provided through the light emission control line so as to apply the power voltage to the driving thin film transistor; wherein, in one frame, the power voltage when the initialization thin film transistor is turned on and the power voltage when the operation control thin film transistor is turned on are different from each other.

In the above OLED display, the power line includes a first line electrically connected to the initialization thin film transistor and a second line electrically connected to the operation control thin film transistor, wherein the first line and the second line cross each other and are connected to each other through a contact hole.

The above OLED display further comprises a compensation thin film transistor electrically connected to the driving thin film transistor and configured to compensate a threshold voltage of the driving thin film transistor.

The above OLED display further comprises a light emission control thin film transistor configured to be turned on based on the light emission control signal provided through the light emission control line so as to provide the power voltage from the driving thin film transistor to the OLED, wherein the light emission control thin film transistor is interposed between the drain of the driving thin film transistor and the OLED.

The above OLED display further comprises: a reset line formed over the substrate and configured to provide a reset signal; and a reset thin film transistor configured to be turned on based on the reset signal provided through the reset line so as to apply the power voltage to an anode of the OLED.

In the above OLED display, the reset transistor is electrically connected to the initialization transistor and the first line.

In the above OLED display, the initialization thin film transistor and the reset thin film transistor are further configured to be concurrently turned on.

The above OLED display further comprises a storage capacitor including a first end electrically connected to the power line and a second end electrically connected to the gate of the driving thin film transistor.

In the above OLED display, the polarity of the power voltage when the initialization thin film transistor is turned on and the polarity of the power voltage when the operation control thin film transistor is turned on are opposite to each other.

Another aspect is a method of driving an organic light-emitting diode (OLED) display including a display unit including a plurality of pixels and a power supply configured to supply a power voltage to the pixels, the driving method comprising: changing the power voltage to a low-level power voltage; applying an enable-level initialization signal to the pixels; and changing the power voltage to a high-level power voltage.

The above method further comprises writing a data signal to the pixels after changing the power voltage to the high-level power voltage.

The above method further comprises applying an enable-level light emission control signal to the pixels after the writing of the data signal to the pixels.

In the above method, the pixels includes an initialization thin film transistor configured to be turned on based on the initialization signal and a driving thin film transistor configured to supply a driving current to the OLED, wherein the applying of the enable level initialization signal to the pixel includes applying the low-level power voltage to a gate of the driving thin film transistor.

The above method further comprises applying an enable-level reset signal to the pixels.

In the above method, the pixel includes a reset thin film transistor configured to be turned on based on the reset signal, wherein the applying of the enable-level reset signal to the pixel includes applying the low-level power voltage to an anode of the OLED.

In the above method, the applying of the enable-level initialization signal to the pixel and the applying of the enable-level reset signal to the pixel are concurrently performed.

Another aspect is an organic light-emitting diode (OLED) display, comprising: a light emission control line configured to provide a light emission control signal; a power line crossing the light emission control line and configured to provide a power voltage; an operation control thin film transistor (TFT) electrically connected to the power line and configured to be turned on based on the light emission control signal so as to provide the power voltage; a driving TFT electrically connected to the operation control TFT; an OLED electrically connected to the driving TFT; and an initialization TFT configured to provide the power voltage to the driving TFT, wherein, in a frame of the OLED display, the power voltage provided when the initialization TFT is turned on and the power voltage provided when the operation control TFT is turned on are different from each other.

The above OLED display further comprises a reset TFT configured to turn on based on a reset signal, wherein the frame includes an initialization period when the reset signal, the initialization signal and the power voltage have an ON voltage level, and wherein the period in which reset signal and the initialization signal have the ON voltage level is less than the period in which the power voltage has the ON voltage level during the initialization period.

The above OLED display further comprises a switching TFT configured to receive a data signal and provide the data signal based on a scan signal, wherein the operation control TFT, the driving TFT and switching TFT are directly connected to each other.

In the above OLED display, a polarity of the power voltage when the initialization TFT is turned on and the polarity of the power voltage when the operation control TFT is turned on are opposite to each other.

According to at least one of the disclosed embodiments, display quality may be improved.

According to at least one of the disclosed embodiments, defective elements included in a pixel may be decreased.

BRIEF DESCRIPTION OF THE DRAWINGS

FIG. 2 is an equivalent circuit diagram explaining a pixel of an OLED display according to the example embodiment of.

DETAILED DESCRIPTION OF CERTAIN INVENTIVE EMBODIMENTS

Hereinafter, exemplary embodiments disclosed in the present specification will be described in detail with reference to the accompanying drawings. In the present specification, the same or similar components will be denoted by the same or similar reference numerals, and duplicate descriptions thereof will be omitted. The terms "module" and "unit" for components used in the following description are used only in order to make the specification more clear. Therefore, these terms do not have meanings or roles that distinguish them from each other by themselves. In describing exemplary embodiments of the present specification, when it is determined that a detailed description of the well-known art associated with the described technology may obscure the gist of the described technology, it will be omitted. The accompanying drawings are provided only in order to allow exemplary embodiments disclosed in the present specification to be easily understood and are not to be interpreted as limiting the spirit disclosed in the present specification, and it is to be understood that the described technology includes all modifications, equivalents, and substitutions without departing from the scope and spirit of the described technology.

Terms including ordinal numbers such as first, second, and the like, will be used only to describe various components, and are not interpreted as limiting these components. The terms are only used to differentiate one component from other components.

It is to be understood that when one component is referred to as being "connected" or "coupled" to another component, it may be connected or coupled directly to another component or be connected or coupled to another component with one or more other components intervening therebetween. On the other hand, it is to be understood that when one component is referred to as being "connected or coupled directly" to another component, it may be connected to or coupled to another component without any other component intervening therebetween.

Singular forms are to include plural forms unless the context clearly indicates otherwise.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof. In this disclosure, the term "substantially" includes the meanings of completely, almost completely or to any significant degree under some applications and in accordance with those skilled in the art. Moreover, "formed on" can also mean "formed over." The term "connected" can include an electrical connection.

An OLED display and a driving method thereof according to an exemplary embodiment may be applied to various electronic devices, such as digital TVs, desktop computers, digital signage, mobile phones, smartphones, laptop computers, digital broadcasting terminals, personal digital assistants (PDAs), portable multimedia players (PMPs), navigation devices, slate computers, tablet computers, ultrabooks, a wearable device (for example, a watch type terminal (a smartwatch), a glass terminal (a smart glass)) and a head mounted display (HMD).

Figure 1:
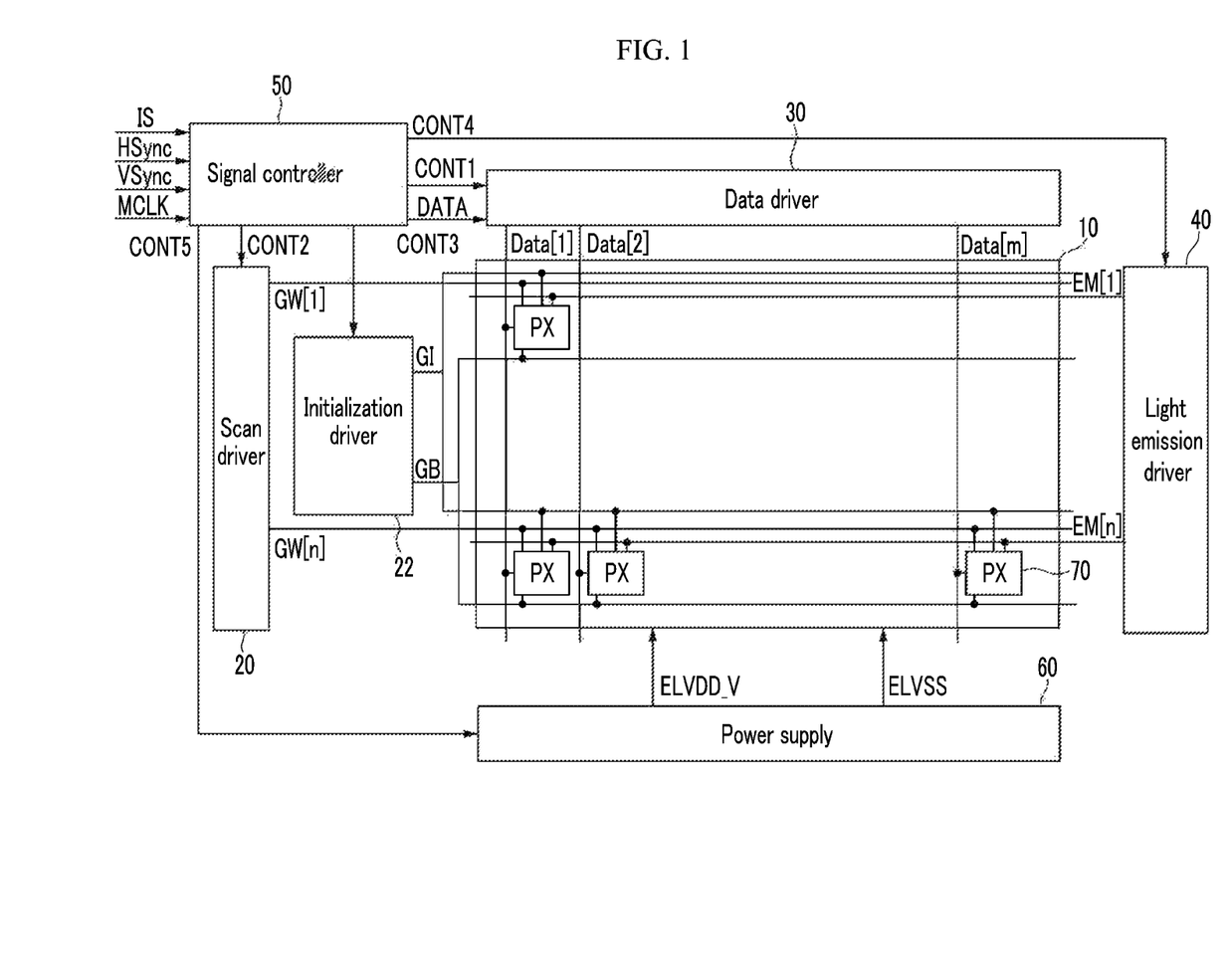
FIG. 1 is a block diagram explaining an OLED display according to an example embodiment.

FIG. 1 is a block diagram explaining an OLED display according to an example embodiment. Depending on embodiments, certain elements may be removed from or additional elements may be added to the OLED display illustrated in FIG. 1. Furthermore, two or more elements may be combined into a single element, or a single element may be realized as multiple elements. This also applies to the remaining disclosed embodiments.

An OLED display includes a display unit 10, a scan driver 20, an initialization driver 22, a data driver 30, a light emission driver 40, a signal controller 50, and a power supply 60. The OLED display described in the present specification may include a larger or smaller number of components than those described above.

The display unit 10 includes a plurality of pixels PX that are connected to corresponding scan lines among a plurality of scan lines, corresponding initialization lines among a plurality of initialization lines, and corresponding data lines among a plurality of data lines. Each of the pixels PX displays an image according to a data signal transmitted thereto.

The pixels PX included in the display unit 10 are respectively connected to the scan lines, the initialization lines, and a plurality of reset lines, a plurality of light emission control lines, and a plurality of data lines which are arranged in an approximate matrix form.

The scan lines substantially extend in a row direction to be substantially parallel to each other. The initialization lines, the reset lines, and the light emission control lines substantially extend in a row direction to be substantially parallel to each other. The data lines substantially extend in a column direction to be substantially parallel to each other.

Each of the pixels PX of the display unit 10 receives a variable driving voltage (ELVDD_V) and a second driving voltage (ELVSS) from a power supply 60.

A scan driver 20 is connected to the display unit 10 through the scan lines. The scan driver 20 generates a plurality of scan signals (GW[1]~GW[n]) according to a control signal (CONT2) and transmits the generated scan signals to corresponding scan lines among the scan lines.

The initialization driver 22 is connected to the display unit 10 through the initialization lines and the reset lines. The initialization driver 22 generates a plurality of initialization signals (GI) and reset signals (GB) according to a control signal (CONT3) and transmits the generated initialization and reset signals to corresponding initialization lines among the initialization lines and corresponding reset lines among the reset lines, respectively. For example, the initialization driver 22 may substantially simultaneously (or concurrently) supply the initialization signal (GI) and the reset signal (GB) to all of the initialization lines and all of the reset lines.

The control signals (CONT2, CONT3) are operating control signals of the scan driver 20 and the initialization driver 22 that are generated and transmitted by the signal controller 50. The control signals (CONT2, CONT3) may include a scan start signal and different types of clock signals. The scan start signal generates a first scan signal (GW[1]) for displaying an image of one frame. One of the clock signals is a synchronization signal for sequentially applying the scan signals (GW[1]~GW[n]) to the scan lines, and another of the clock signals is a synchronization signal for substantially simultaneously applying the initialization signal (GI) and the reset signal (GB) to the initialization lines.

The data driver 30 is connected to each pixel PX of the display unit 10 through the data lines. The data driver 30 receives an image data signal (DATA) and transmits data signals (Data[1]~Data[m]) to corresponding data lines among the data lines according to a control signal (CONT1).

The control signal (CONT1) is an operating control signal of the data driver 30 that is generated and transmitted by the signal controller 50.

The data driver 30 selects a gray voltage according to the image data signal (DATA) and transmits the selected gray voltage as the data signals (Data[1]~Data[m]) to the data lines.

The data driver 30 samples and holds the image data signal (DATA) inputted according to the control signal (CONT1), and it respectively transmits the data signals (Data[1]~Data[m]) to the data lines. For example, the data driver 30 may apply the data signals (Data[1]~Data[m]) having a predetermined voltage range to the data lines depending on the scan signals (GW[1]~GW[n]) of a gate-on voltage.

The light emission driver 40 generates a plurality of light emission control signals (EM[1]~EM[n]) according to a light emission control signal (CONT4). The light emission driver 40 respectively transmits the light emission control signals (EM[1]~EM[n]) to a plurality of light emission control lines according to the control signal (CONT4).

The signal controller 50 receives an image signal (IS) inputted from the outside and an input control signal controlling the image signal (IS). The image signal (IS) may include luminance information that is differentiated based on gray of each pixel PX of the display unit 10, and the above-described frame data.

Meanwhile, an input control signal transmitted to the signal controller 50 may be a vertical synchronization signal (Vsync), a horizontal synchronization signal (Hsync), a main clock signal (CLK), or the like.

The signal controller 50 generates control signals (CONT1-CONT5) and the image data signal (DATA) according to the image signal (IS), the horizontal synchronization signal (Hsync), the vertical synchronization signal (Vsync), and the main clock signal (MCLK).

The signal controller 50 processes the image signal (IS) according to the operating conditions of the display unit 10 and the data driver 30 based on the inputted image signal (IS) and the input control signal. For example, the signal controller 50 generates the image data signal (DATA) by applying image processes such as gamma correction, luminance compensation, and the like to the image signal (IS).

For example, the signal controller 50 generates the control signal (CONT1) controlling operation of the data driver 30, and transmits the generated control signal (CONT1) along with the image data signal (DATA) processed by the image processes to the data driver 30. Further, the signal controller 50 transmits the control signal (CONT2) controlling operation of the scan driver 20 to the scan driver 20. Further, the signal controller 50 transmits the control signal (CONT3) controlling operation of the initialization driver 22 to the initialization driver 22. Further, the signal controller 50 may transmit the light emission control signal (CONT4) to the light emission driver 40 to drive the light emission driver 40.

In addition, the signal controller 50 may control the power supply 60. The power supply 60 may supply power voltages (ELVDD_V, ELVSS) for driving each pixel PX of the display unit 10. For example, the signal controller 50 transmits the power control signal (CONT5) to the power supply 60 to drive the power supply 60.

The power supply 60 is connected to power lines formed in the display panel 10. The power supply 60 may change a voltage level of a variable power voltage (ELVDD_V) according to the control signal (CONT5). For example, the power supply 60 supplies a high-level variable power voltage (ELVDD_V) and a low-level variable power voltage (ELVDD_V) to the same power line formed in the display panel 10. In addition, a fixed power voltage (ELVSS) may be fixed at a low level, and it may be supplied to the power line formed in the display panel 10.

Next, a pixel of an OLED display according to the present exemplary embodiment will be described in detail with respect to FIGS. 2 to 4.

Figure 2:
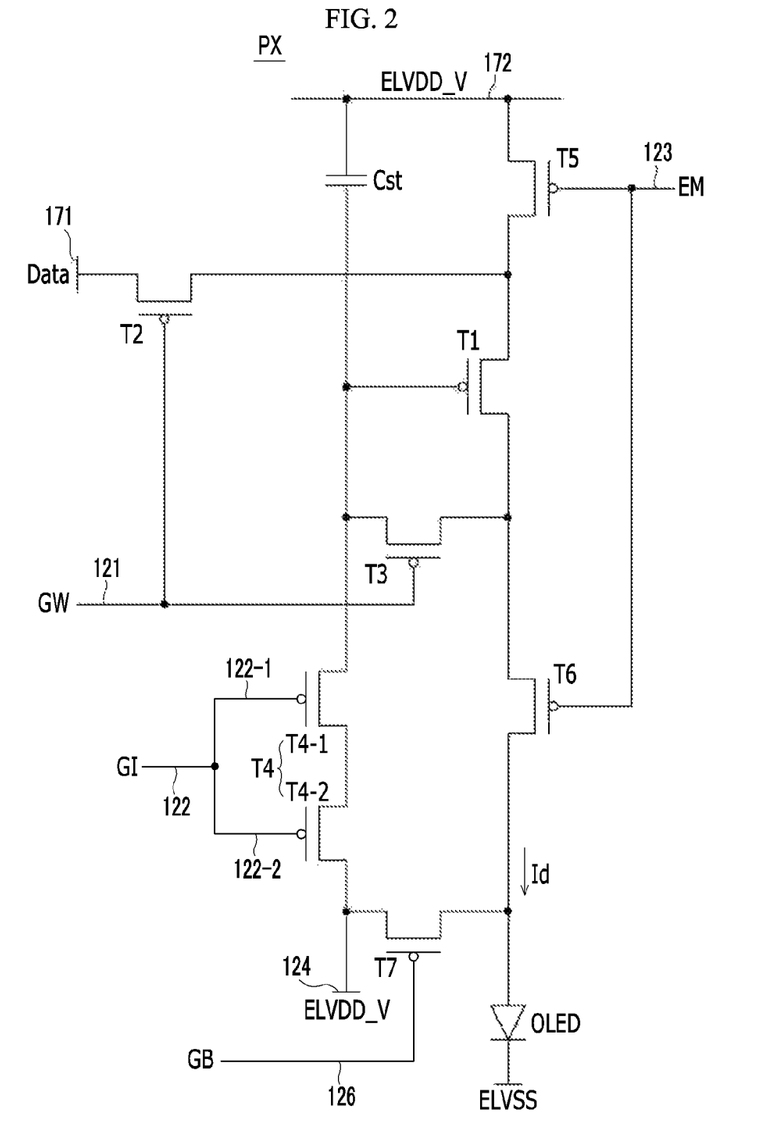

FIG. 2 is an equivalent circuit diagram explaining a pixel of an OLED display according to an example embodiment.

As shown in FIG. 2, one pixel PX of the OLED display according to the exemplary embodiment includes a plurality of signal lines (121, 122, 123, 124, 125, 171, 172), a plurality of thin film transistors (T1, T2, T3, T4, T5, T6, T7) connected the plurality of signal lines, a storage capacitor (Cst), and an organic light-emitting diode (OLED).

The thin film transistors include a driving thin film transistor T1, a switching thin film transistor T2, a compensation thin film transistor T3, an initialization thin film transistor T4, an operation control thin film transistor T5, a light emission control thin film transistor T6, and a reset thin film transistor T7.

The signal lines include a scan line 121 transmitting the scan signal (GW), an initialization line 122 transmitting the initialization signal (GI) to the initialization thin film transistor T4, a reset line 126 transmitting the reset signal (GB) to the reset thin film transistor T7, a light emission control line 123 transmitting the light emission control signal (EM) to the operation control thin film transistor T5 and the light emission control thin film transistor T6, a data line 171 crossing the scan line 121 and transmitting the data signal (DATA), a power line 172 transmitting the variable power voltage (ELVDD_V) and formed to be substantially parallel to the data line 171, and a power line 124 transmitting the variable power voltage (ELVDD_V) that initializes the driving thin film transistor T1 and the organic light-emitting diode (OLED).

The gate of the driving thin film transistor T1 is connected to one end Cst1 of the storage capacitor Cst, the source of the driving thin film transistor T1 is connected to the power line 172 via the operation control thin film transistor T5, and the drain of the driving thin film transistor T1 is electrically connected to the anode of the organic light-emitting diode (OLED) via the light emission control thin film transistor T6. The driving thin film transistor T1 receives the data signal (DATA) according to a switching operation of the switching thin film transistor T2 to supply a driving current (Id) to the organic light emitting diode (OLED).

The gate of the switching thin film transistor T2 is connected to the scan line 121, and the source of the switching thin film transistor T2 is connected to the data line 171. The drain of the switching thin film transistor T2 is connected to the power line 172 via the operation control thin film transistor T5 while being connected to the source of the driving thin film transistor T1.

The switching thin film transistor T2 is turned on according to the scan signal (GW) transmitted through the scan line 121 to transmit the data signal (DATA) transmitted to the data line 171 to the source of the driving thin film transistor T1, through the switching operation thereof.

The gate of the compensation thin film transistor T3 is connected to the scan line 121, and the source of the compensation thin film transistor T3 is connected to the anode of the organic light-emitting diode (OLED) via the light emission control thin film transistor T6 while being connected to the drain of the driving thin film transistor T1. The drain of the compensation thin film transistor T3 is connected to one end Cst1 of the storage capacitor Cst, the drain of the initialization thin film transistor T4, and the gate of the driving thin film transistor T1.

The compensation thin film transistor T3 is turned on according to the scan signal (GW) transmitted through the scan line 121 to connect the gate and the drain of the driving thin film transistor T1 to each other, such that the driving thin film transistor T1 may be operated as a diode.

The initialization thin film transistor T4 forms double-gate transistors T4-1 and T4-2, thereby preventing current leakage. The gate of the initialization thin film transistor T4-1 is connected to an initialization line 122-1, and the drain of the initialization thin film transistor T4-1 is connected to the source of the initialization thin film transistor T4-2. The source of the initialization thin film transistor T4-1 is connected to the one end of the storage capacitor Cst, the drain of the compensation thin film transistor T3, and the gate of the driving thin film transistor T1.

The gate of the initialization thin film transistor T4-2 is connected to a initialization line 122-2, the drain of the initialization thin film transistor T4-2 is connected to the power line 124, and the source of the initialization thin film transistor T4-2 is connected to the drain of the initialization thin film transistor T4-1.

The initialization thin film transistor T4 is turned on according to the initialization signal (GI) transmitted through the initialization line 122 to transmit the low-level variable power voltage (ELVDD_V) to the gate of the driving thin film transistor T1 such that a voltage of the gate of the driving thin film transistor T1 may be initialized.

The gate of the operation control thin film transistor T5 is connected to the light emission control line 123, the source of the operation control thin film transistor T5 is connected to the power line 172, and the drain of the operation control thin film transistor T5 is connected to the source of the driving thin film transistor T1 and the drain of the switching thin film transistor T2.

The gate of the light emission control thin film transistor T6 is connected to the light emission control line 123, and the source of the light emission control thin film transistor T6 is connected to the drain of the driving thin film transistor T1 and the source of the compensation thin film transistor T3. The drain of the light emission control thin film transistor T6 is electrically connected to the anode of the organic light-emitting diode (OLED) and the source of the reset thin film transistor T7.

The operation control thin film transistor T5 and the light emission control thin film transistor T6 are simultaneously turned on according to the light emission control signal (EM) transmitted through the light emission control line 123, such that the high-level variable power voltage (ELVDD_V) may be transmitted to the organic light-emitting diode (OLED) for the driving current (Id) to flow through the organic light-emitting diode (OLED).

The gate of the reset thin film transistor T7 is connected to the reset line 126, the drain of the reset thin film transistor T7 is connected to the power line 124, the source of the reset thin film transistor T7 is electrically connected to the anode of the organic light emitting diode (OLED) and the drain of the light emission control thin film transistor T6.

The reset thin film transistor T7 is substantially simultaneously (or concurrently) turned on according to the reset signal (GB) transmitted through the reset line 126 to initialize an anode voltage of the organic light-emitting diode (OLED) in the low-level variable power voltage (ELVDD_V).

The other end of the storage capacitor Cst is connected to the power line 172, and the cathode of the OLED is connected to the common voltage (ELVSS). Accordingly, the organic light-emitting diode (OLED) receives the driving current (Id) from the driving thin film transistor T1 and then emits light to display an image.

A detailed structure of the pixel of the OLED display shown in FIG. 2 will be described in detail with reference to FIGS. 3 and 4, along with FIG. 2.

Figure 3:
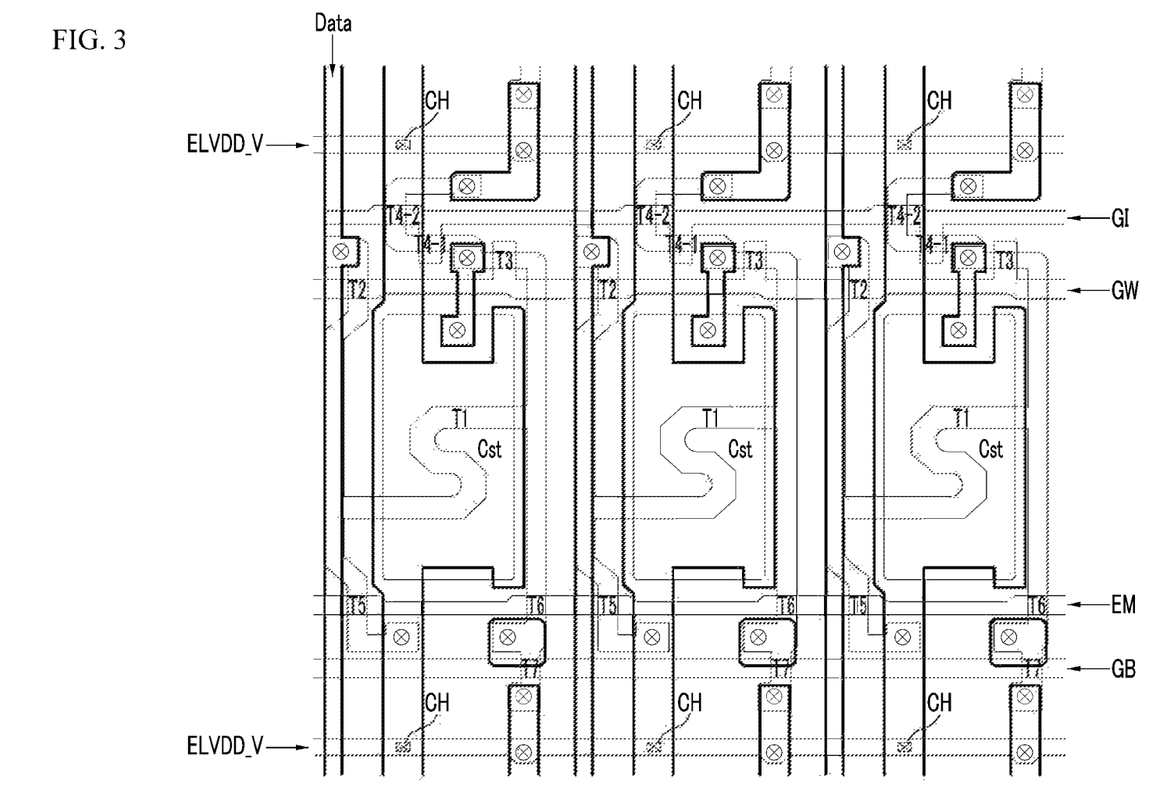
FIG. 3 is a schematic diagram illustrating positions of a plurality of thin film transistors and capacitors of an OLED display according to the example embodiment.

FIG. 3 is a schematic diagram illustrating positions of a plurality of thin film transistors and capacitors of an OLED display according to the example embodiment. FIG. 4 is a layout view of one pixel of an OLED display according to the example embodiment.

Figure 4:
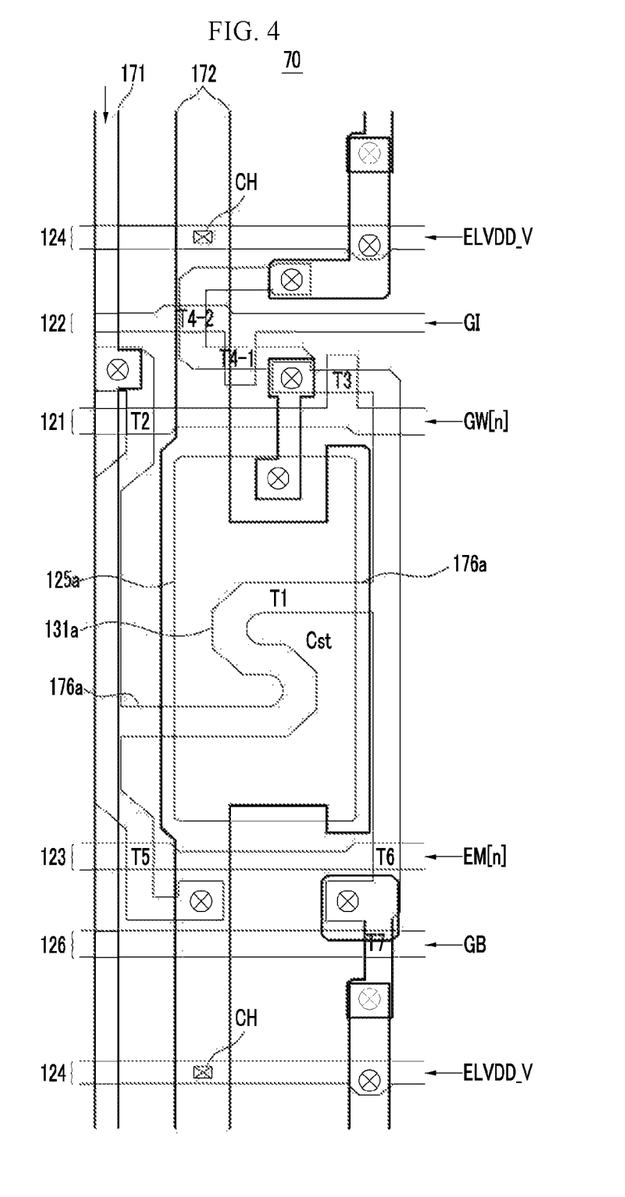
FIG. 4 is a layout view of one pixel of an OLED display according to the example embodiment.

As shown in FIGS. 3 and 4, the pixel of the OLED display according to the exemplary embodiment includes the scan line 121, the initialization line 122, the light emission control line 123, and the power line 124, which respectively apply the scan signal (GW), the initialization signal (GI), the light emission control signal (EM), and the low-level variable power voltage (ELVDD_V), and which are formed in a row direction.

Further, the pixel crosses all of the scan line 121, the initialization line 122, the light emission control line 123, and power line 124, and it includes the data line 171 and the power line 172 that respectively apply the data signal (DATA) and the high-level variable power voltage (ELVDD_V) thereto.

In this case, the power line 124 and the power line 172 may be connected to each other through a contact hole (CH). At least one of the power line 124 and the power line 172 receives the variable power voltage (ELVDD_V) from the power supply 60. Then, since the power line 124 and the power line 172 are connected to each other, the variable power voltage (ELVDD_V) is supplied to the source of the operation control thin film transistor T5, the drain of the reset thin film transistor T7, the drain of the initialization thin film transistor T4-2, as well as the other end of the storage capacitor Cst. The variable power voltage (ELVDD_V) is changed to a high-level voltage or a low-level voltage. This will be described later with reference to FIGS. 5 and 6.

In addition, the driving thin film transistor T1, the switching thin film transistor T2, the compensation thin film transistor T3, the initialization thin film transistor T4, the operation control thin film transistor T5, the light emission control thin film transistor T6, the reset thin film transistor T7, and storage capacitor Cst are formed in the pixel.

The driving thin film transistor T1, the switching thin film transistor T2, the compensation thin film transistor T3, the initialization thin film transistor T4, the operation control thin film transistor T5, the light emission control thin film transistor T6, and the reset thin film transistor T7 are formed along a semiconductor layer, and the semiconductor layer is formed to be bent into various shapes.

The semiconductor layer includes a driving semiconductor layer 131a formed in the driving thin film transistor T1, a switching semiconductor layer formed in the switching thin film transistor T2, a compensation semiconductor layer formed in the compensation thin film transistor T3, an initialization semiconductor layer formed in the initialization thin film transistor T4, an operating control semiconductor layer formed in the operation control thin film transistor T5, a light emission semiconductor layer formed in the light emission control thin film transistor T6, and a reset semiconductor layer formed in the reset thin film transistor T7.

The driving thin film transistor T1 includes a driving semiconductor layer 131a, a driving gate 125a, a driving source 176a, and a driving drain 177a. The driving semiconductor layer 131a is bent. The driving semiconductor layer 131a is extendedly formed in a 'Z' shape. The driving semiconductor layer 131a may be formed in various shapes, including 'S', 'M', and 'W' shapes.

As such, by forming the driving semiconductor layer 131a in a bent shape, the driving semiconductor layer 131a may be formed to extend in a narrow space. Accordingly, a driving channel region of the driving semiconductor layer 131a may be formed to extend, such that a driving range of the gate voltage applied to the driving gate 125a is widened. Accordingly, since the driving range of the gate voltage is widened such that the gate voltage may be varied, gray in light emitted from the organic light-emitting diode (OLED) is precisely controlled, and as a result, resolution and display quality of the OLED display may be improved.

The transistors (T1~T7) may be at least one of an amorphous silicon thin film transistor (amorphous-Si TFT), a low temperature poly-silicon (LTPS) thin film transistor, or an oxide thin film transistor (Oxide TFT). The oxide thin film transistor (Oxide TFT) may include an oxide semiconductor layer formed of amorphous indium-gallium-zinc-oxide (IGZO), zinc-oxide (ZnO), titanium oxide (TiO), or the like.

A driving method of the OLED display and operation processes of one pixel according to the exemplary embodiment will now be described in detail with reference to FIGS. 5 and 6. The OLED display generates an image corresponding to the image signal (IS) during a plurality of consecutive frames.

In the OLED display of the present exemplary embodiment, when data writing is finished in any one pixel, such pixel is operated by a sequential light emitting method that starts light emission. Accordingly, when the data writing order is sequential from the first row pixel to the n-th row pixel, the first to n-th row pixels sequentially emit light according to the order the data writing is completed.

An OLED display according to another exemplary embodiment is operated by a simultaneous light emitting method. The simultaneous light emitting method means a method in which a plurality of pixels that are emitted during a corresponding frame substantially simultaneously (or concurrently) emit light such that an image of one frame displayed in the display device is simultaneously displayed.

The data writing should be completed for all the pixels before the light emission period so that all the pixels may simultaneously emit light. If the period of one frame is divided into a scan period for writing the data to all the pixels and a light emission period, the scan period may be less than half of one frame period. Further, the light emission period may be less than half of one frame period.

Hereinafter, an exemplary embodiment in which the OLED display is operated by the sequential light emitting method will be described in detail.

Figure 5:
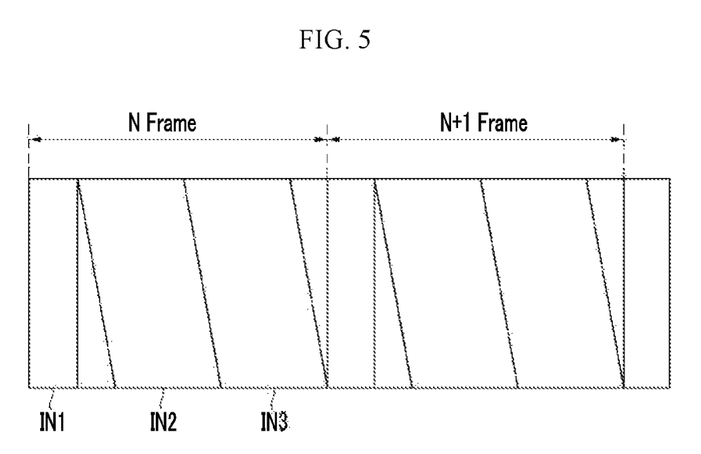
FIG. 5 is a schematic diagram illustrating a plurality of frames depending on a driving method of an OLED display according to the example embodiment.
Figure 6:
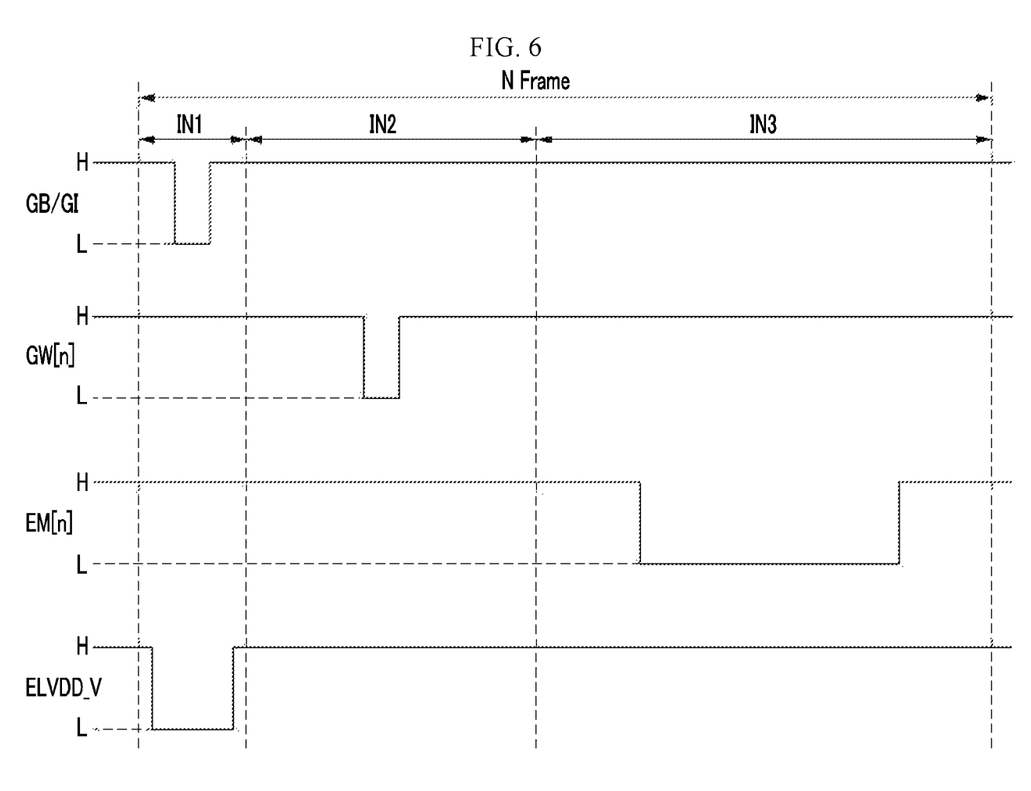
FIG. 6 is a timing diagram for explaining a specific operation of a pixel of an OLED display according to the example embodiment.

FIG. 5 is a schematic diagram illustrating a plurality of frames (N frame, N+1 frame) depending on a driving method of an OLED display according to the example embodiment. FIG. 6 is a timing diagram for explaining the specific operation of a pixel of an OLED display according to the example embodiment.

As shown in FIG. 5, one frame (N frame) may sequentially include an initialization period IN1, a scan period IN2, and a light emission period IN3.

First, during the initialization period IN1, the anode voltage of the organic light-emitting diode (OLED) is discharged and the gate voltage of the driving thin film transistor T1 of the pixel is initialized at a low-level (L) voltage. Further, the initialization signal (GI) and the reset signal (GB) are substantially simultaneously (or concurrently) supplied to all the pixels during the initialization period IN1. In this case, the power supply applies the low-level (L) variable power voltage (ELVDD_V) to the power lines of all the pixels.

Next, during the scan period IN2, data are sequentially written to the pixels, the scan driver sequentially supplies the scan signal (GW) to all the pixels, and the data driver supplies a corresponding data signal (DATA) to a corresponding pixel. In this case, the power supply applies a high-level (H) variable power voltage (ELVDD_V) to the power lines of all the pixels.

Next, during the light emission period IN3, the pixel to which a data signal is applied emits light, and the light emitting driver sequentially supplies the light emission control signal (EM) to all the pixels.

Operation processes of one pixel will be described with reference to FIG. 6.

First, the low-level (L) initialization signal (GI) is supplied through the initialization line 122 and the low-level (L) reset signal (GB) is supplied through the reset line 126, during the initialization period IN1.

Then, the initialization thin film transistor T4 is turned on depending on the low-level (L) initialization signal (GI), the low-level (L) variable power voltage (ELVDD_V) is applied to the gate of the driving thin film transistor T1 through the initialization thin film transistor T4 from the power line 124, and the driving thin film transistor T1 is initialized by the low-level (L) variable power voltage (ELVDD_V).

Further, the reset thin film transistor T7 is turned on depending on the low-level (L) reset signal (GB), the low-level (L) variable power voltage (ELVDD_V) is applied to the anode of the organic light-emitting diode (OLED) through the reset thin film transistor T7 from the power line 124, and the organic light-emitting diode (OLED) is initialized by the low-level (L) variable power voltage (ELVDD_V).

In the present exemplary embodiment, the low-level (L) variable power voltage (ELVDD_V) is supplied to the drain of the reset thin film transistor T7 and the drain of the initialization thin film transistor T4-2 during the initialization period IN1 such that the anode voltage of the organic light-emitting diode (OLED) is discharged and the gate voltage of the driving thin film transistor T1 of the pixel is initialized at the low-level (L) voltage. Accordingly, a separate wire for supplying the initialization voltage to the initialization thin film transistor T4 and the reset thin film transistor T7 may not be formed in the pixel. As a result, an area of elements included in the pixel, for example, an area of the storage capacitor Cst, may be widely formed, and thus the OLED display according to the present exemplary embodiment may variously express gray.

When the initialization period IN1 ends, the variable power voltage (ELVDD_V) is changed to the high-level (H), which is maintained for the scan period IN2 and the light emission period IN3.

Next, the low-level (L) scan signal (GW[n]) is supplied through the scan line 121 during the scan period IN2. Accordingly, the switching thin film transistor T2 and the compensation thin film transistor T3 are turned on depending on the low-level (L) scan signal (GW[n]).

In this case, the driving thin film transistor T1 is operated like a diode by the turned-on compensation thin film transistor T3, that is, it is biased in a forward direction.

Accordingly, a compensation voltage decreased by a threshold voltage Vth of the driving thin film transistor T1 in the data signal (DATA) supplied from the data line 171 is applied to the gate of the driving thin film transistor T1.

The high-level (H) variable power voltage (ELVDD_V) and the compensation voltage are applied to opposite ends of the storage capacitor Cst, and charges corresponding to a voltage difference between the opposite ends thereof are stored in the storage capacitor Cst. Thereafter, during the light emission period IN3, the emission control signal (EM[n]) supplied through the emission control line 123 is changed to the low-level (L) from the high-level (H). During the light emission period IN3, the operation control transistor T5 and the light emission control thin film transistor T6 are turned on by the low-level emission control signal (EM[n]).

Then, the driving current (Id) caused by the voltage difference between the gate voltage of the driving thin film transistor T1 and the high-level (H) variable power voltage (ELVDD_V) is generated and is supplied to the organic light-emitting diode (OLED) through the light emission control thin film transistor T6.

In the present exemplary embodiment, the thin film transistors (T1~T7) may be a p-type transistor. In this case, the gate-on voltage turning on the thin film transistors (T1~T7) is the low-level voltage, and the gate-off voltage turning off the thin film transistors (T1~T7) is the high-level voltage.

Herein, the p-type transistor is illustrated, but at least one of the thin film transistors (T1~T7) may be an n-type transistor. In this case, a gate-on voltage turning on the n-type transistor is the high-level voltage, and a gate-off voltage turning off the n-type transistor is the low-level voltage.

A polarity of the high-level (H) variable power voltage (ELVDD_V) and a polarity of the low-level (L) variable power voltage (ELVDD_V) may be opposite to each other.

At least some of the respective components described above may be cooperatively operated in order to implement an operation, a control, or a driving method of the pixel and the OLED display including the pixel according to the above-described various exemplary embodiments.

The above-described exemplary embodiments may be implemented as a code in a computer readable medium in which a program is recorded. The computer readable medium may include all kinds of recording apparatuses in which data that may be read by a computer system are stored. An example of the computer readable medium may include a hard disk drive (HDD), a solid state disk (SSD), a silicon disk drive (SDD), a read only memory (ROM), a random access memory (RAM), a compact disk read only memory (CD-ROM), magnetic tape, a floppy disk, optical data storage, or the like, and may also include a medium implemented in a form of a carrier wave (for example, transmission through the Internet). The computer may also include a controller of a terminal. Therefore, the above detailed description is not to be interpreted as being restrictive, but is to be considered as being illustrative. The scope of the present invention is to be determined by a reasonable interpretation of the claims, and all alternatives within equivalents of the present invention fall within the scope of the present invention.

While the inventive technology has been described with reference to the figures, it will be understood by those of ordinary skill in the art that various changes in form and details can be made therein without departing from the spirit and scope as defined by the following claims.

What is claimed is:

1. An organic light-emitting diode (OLED) display, comprising:
    a substrate;
    a scan line formed over the substrate and configured to provide a scan signal;
    an initialization line formed over the substrate and configured to provide an initialization signal;
    a light emission control line formed over the substrate and configured to provide a light emission control signal;
    a data line crossing the scan line and configured to provide a data signal;
    a power line crossing the scan line and configured to provide a power voltage;
    a switching thin film transistor (TFT) electrically connected to the scan line and the data line;
    a driving thin film transistor electrically connected to a drain electrode of the switching thin film transistor;
    an OLED electrically connected to a drain electrode of the driving thin film transistor;
    an initialization thin film transistor configured to be turned on based on the initialization signal provided through the initialization line so as to apply the power voltage to a gate electrode of the driving thin film transistor; and
    an operation control thin film transistor configured to be turned on based on the light emission control signal provided through the light emission control line so as to apply the power voltage to the driving thin film transistor,
    wherein, in one frame, the power voltage when the initialization thin film transistor is turned on and the power voltage when the operation control thin film transistor is turned on are different from each other, and
    wherein the polarity of the power voltage when the initialization thin film transistor is turned on and the polarity of the power voltage when the operation control thin film transistor is turned on are opposite to each other.

2. The OLED display of claim 1, wherein the power line includes a first line electrically connected to the initialization thin film transistor and a second line electrically connected to the operation control thin film transistor, and wherein the first line and the second line cross each other and are connected to each other through a contact hole.

3. The OLED display of claim 2, further comprising a compensation thin film transistor electrically connected to the driving thin film transistor and configured to compensate a threshold voltage of the driving thin film transistor.

4. The OLED display of claim 3, further comprising a light emission control thin film transistor configured to be turned on based on the light emission control signal provided through the light emission control line so as to provide the power voltage from the driving thin film transistor to the OLED, wherein the light emission control thin film transistor is interposed between the drain of the driving thin film transistor and the OLED.

5. The OLED display of claim 4, further comprising:
a reset line formed over the substrate and configured to provide a reset signal; and
a reset thin film transistor configured to be turned on based on the reset signal provided through the reset line so as to apply the power voltage to an anode of the OLED.

6. The OLED display of claim 5, wherein the reset transistor is electrically connected to the initialization transistor and the first line.

7. The OLED display of claim 6, wherein the initialization thin film transistor and the reset thin film transistor are further configured to be concurrently turned on.

8. The OLED display of claim 7, further comprising a storage capacitor including a first end electrically connected to the power line and a second end electrically connected to the gate of the driving thin film transistor.

9. A method of driving an organic light-emitting diode (OLED) display including a display unit;
a substrate;
a scan line formed over the substrate and configured to provide a scan signal;
an initialization line formed over the substrate and configured to provide an initialization signal;
a light emission control line formed over the substrate and configured to provide a light emission control signal;
a data line crossing the scan line and configured to provide a data signal;
a power line crossing the scan line and configured to provide a power voltage;
a switching thin film transistor (TFT) electrically connected to the scan line and the data line;
a driving thin film transistor electrically connected to a drain electrode of the switching thin film transistor;
an OLED electrically connected to a drain electrode of the driving thin film transistor;
an initialization thin film transistor configured to be turned on based on the initialization signal provided through the initialization line so as to apply the power voltage to a gate electrode of the driving thin film transistor;
a reset thin film transistor configured to be turned on based on a reset signal; and
an operation control thin film transistor configured to be turned on based on the light emission control signal provided through the light emission control line so as to apply the power voltage to the driving thin film transistor,
wherein the display unit includes a plurality of pixels and a power supply configured to supply a power voltage to the pixels,
the driving method comprising:
changing the power voltage to a low-level power voltage;
applying an enable-level initialization signal to the pixels;
applying an enable-level reset signal to the pixels; and
changing the power voltage to a high-level power voltage,
wherein the period in which the reset signal and the initialization signal have the low-level voltage level is less than the period in which the power voltage has the low-level voltage level during the initialization period.

10. The method of claim 9, further comprising writing a data signal to the pixels after changing the power voltage to the high-level power voltage.

11. The method of claim 10, further comprising applying an enable-level light emission control signal to the pixels after the writing of the data signal to the pixels.

12. The method of claim 11, wherein the pixels includes an initialization thin film transistor configured to be turned on based on an enable level initialization signal and a driving thin film transistor configured to supply a driving current to the OLED, and wherein the applying of the enable level initialization signal to the pixel includes applying the low-level power voltage to a gate of the driving thin film transistor.

13. The method of claim 9, wherein the reset thin film transistor is configured to be turned on based on the reset signal, and wherein the applying of the enable-level reset signal to the pixel includes applying the low-level power voltage to an anode of the OLED.

14. The method of claim 13, wherein the applying of the enable-level initialization signal to the pixel and the applying of the enable-level reset signal to the pixel are concurrently performed.

15. An organic light-emitting diode (OLED) display, comprising:
a light emission control line configured to provide a light emission control signal;
a power line crossing the light emission control line and configured to provide a power voltage;
an operation control thin film transistor (TFT) electrically connected to the power line and configured to be turned on based on the light emission control signal so as to provide the power voltage;
a driving TFT electrically connected to the operation control TFT;
an OLED electrically connected to the driving TFT;
an initialization TFT configured to provide the power voltage to the driving TFT; and
a reset TFT configured to turn on based on a reset signal, wherein the frame includes an initialization period when the reset signal, the initialization signal and the power voltage have an ON voltage level, and wherein the period in which the reset signal and the initialization signal have the ON voltage level is less than the period in which the power voltage has the ON voltage level during the initialization period,
wherein, in a frame of the OLED display, the power voltage provided when the initialization TFT is turned on and the power voltage provided when the operation control TFT is turned on are different from each other.

16. The OLED display of claim 15, further comprising a switching TFT configured to receive a data signal and provide the data signal based on a scan signal, and wherein the operation control TFT, the driving TFT and switching TFT are directly connected to each other.

17. The OLED display of claim 16, wherein a polarity of the power voltage when the initialization TFT is turned on and the polarity of the power voltage when the operation control TFT is turned on are opposite to each other.

* * * * *